United States Patent [19]

Haugen

[11] Patent Number: 4,827,534
[45] Date of Patent: May 9, 1989

[54] SUN-POWERED VEST

[76] Inventor: Alvin E. Haugen, 7002 - 36th Ave., N., Crystal, Minn. 55427

[21] Appl. No.: 198,861

[22] Filed: May 26, 1988

[51] Int. Cl.⁴ .............................................. A41D 1/02
[52] U.S. Cl. .......................................... 2/108; 2/102; 136/291
[58] Field of Search ...................... 2/94, 102, 108, 115; 136/291

[56] References Cited

U.S. PATENT DOCUMENTS

| | | | |
|---|---|---|---|
| 3,055,133 | 9/1962 | Anderson | 2/102 |
| 3,353,191 | 11/1967 | Dahly | |
| 3,844,840 | 10/1974 | Bender | |
| 4,539,714 | 9/1985 | Fratti | 2/108 |
| 4,551,857 | 11/1985 | Galvin | |
| 4,697,360 | 10/1987 | Sartor | |

FOREIGN PATENT DOCUMENTS 1904154 1/1981 Canada .
3243797 5/1984 Fed. Rep. of Germany .
3421832 12/1985 Fed. Rep. of Germany ...... 136/291

*Primary Examiner*—Werner H. Schroeder
*Assistant Examiner*—D. Biefeld
*Attorney, Agent, or Firm*—Orrin M. Haugen; Thomas J. Nikolai; Frederick W. Niebuhn

[57] ABSTRACT

A vest garment to be worn by persons working out of doors and which has an array of photovoltaic cells mounted on the back panel thereof. The individual cells are connected in series relationship with one another across a pair of output terminals which are brought out through a belt attached along the waistband of the vest to an output jack. The voltage developed across the photocell array may then be used to charge rechargeable batteries suspended from the belt or, alternatively, they be coupled to an input jack of a power tool having a self-contained rechargeable battery whereby charging current is generated when the vest is being worn out of doors.

10 Claims, 1 Drawing Sheet

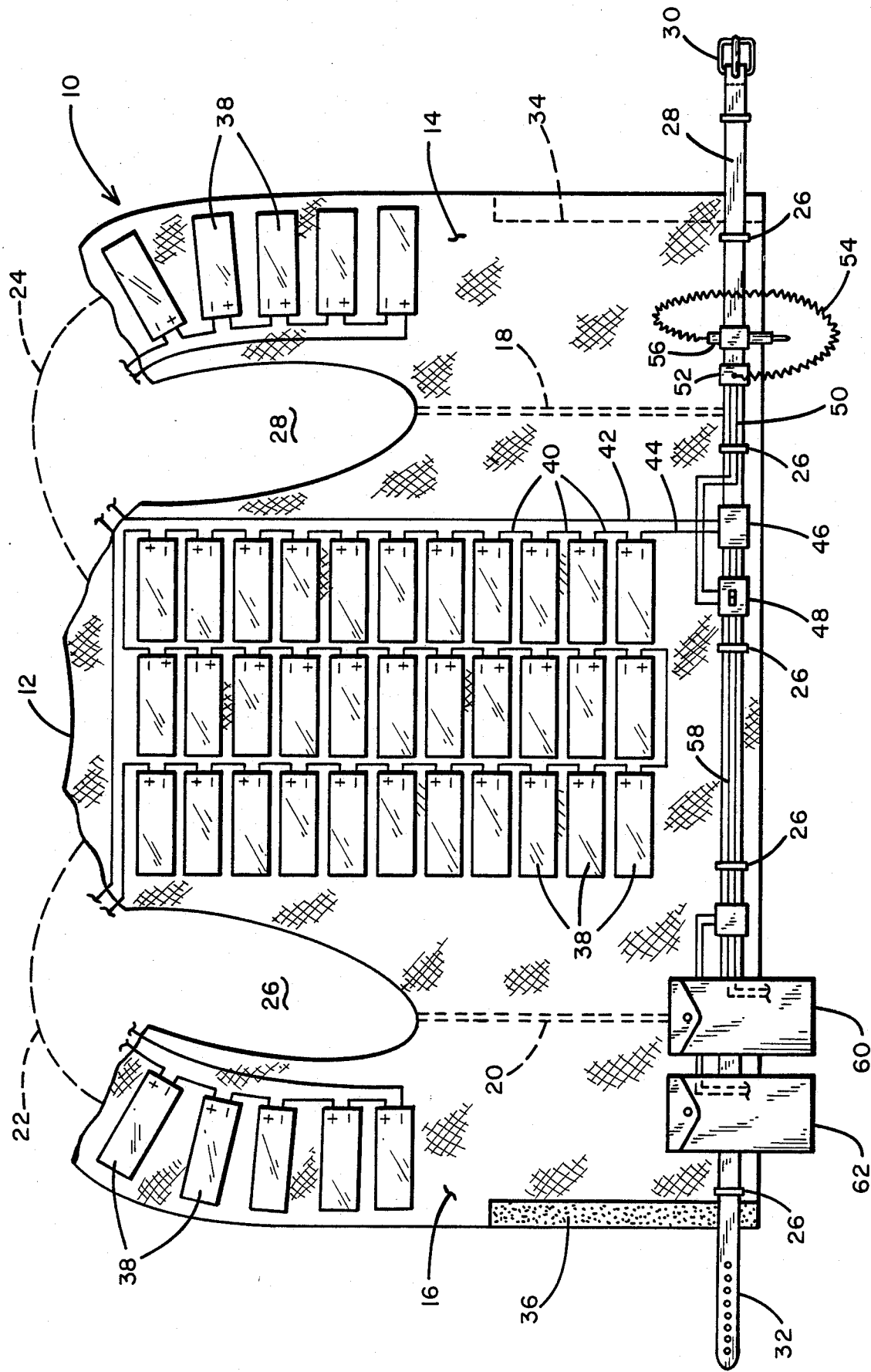

SUN-POWERED VEST

BACKGROUND OF THE INVENTION

I. Field of the Invention

This invention relates generally to a vest with sun-powered electric or electronic devices, and more particularly to a vest having an array of series connected photovoltaic cells disposed thereon to be worn by workmen utilizing rechargeable battery-operated tools or other equipment.

II. Discussion of the Prior Art

Photovoltaic cells are now available at reasonable prices and of an output capacity making it possible to operate small motors or other items of electrical equipment. It is also recognized in the art that such photocells can be mounted as an array of an item of apparel. In this regard, reference is made to the Bender U.S. Pat No. 3,844,840 which describes a cyclist's helmet on which is mounted a plurality of photovoltaic cells, with the energy developed thereby being used to power a transistor radio carried by the cyclist.

Another example of a sun-powered item of clothing is described in the Sartor U.S. Pat. No. 4,697,360. It describes a ski boot having photoelectric cells secured thereto as an array and the electrical current produced by the array is passed through resistive heating elements to maintain the wearer's feet at comfortable temperature.

OBJECTS

It is a principal object of the present invention to provide a workman's vest having a tool belt from which a variety of motor-driven hand tools and rechargeable battery packs may be carried or suspended and where the vest includes an array of photovoltaic cells for generating electrical power used in energizing the tools and maintaining the charge on the batteries.

Another object of the invention is to provide a workman's vest and belt combination of the type described in the foregoing object and wherein the electrical output from the photocell array is routed through wires contained in the vest's belt.

Yet another object of the invention is to provide a workman's vest of the type described in which the electrical wires routed through the vest's belt provide electrical energy to rechargeable battery packs suspended from the belt or to tools readily connectable to a jack connected to the wires.

SUMMARY OF THE INVENTION

In accordance with the present invention there is provided a vest-type garment which is preferably fabricated from canvas, denim or other durable material and which is designed to cover the wearer's back, shoulders and chest. It includes a suitable closure means, such as a Velcro ® strip, extending vertically along opposed edges of the chest panels thereof and which, when joined, maintain the vest closed about the wearer's chest and stomach. The vest further includes belt loops formed around the waistband of the garment for receiving a tool belt therethrough from which a variety of battery-operated power tools may be suspended. Attached to the exterior back surface or panel of the vest is an array of photovoltaic cells where the cells in the array are all connected in series circuit relationship for providing a predetermined voltage cross a pair of output terminals. A pair of wires connect to those array output terminals and are routed through the belt to a voltage regulator and to a switch which, when set in one position, provides the output to a first jack to which a portable power tool may be connected or, alternatively, to one or more rechargeable battery packs suspended from the belt.

DESCRIPTION OF THE DRAWINGS

The foregoing objects and advantages of the invention will become apparent to those skilled in the art from the following detailed description of a preferred embodiment, especially when considered in conjunction with the accompanying drawing which illustrates a developed view of the sun-powered vest comprising the preferred embodiment of the invention.

DESCRIPTION OF THE PREFERRED EMBODIMENT

With reference to the accompanying drawing, there is identified generally by numeral 10, the workman's vest embodying the present invention. It is seen to include a vest-type garment which may be fabricated from a variety of materials, with canvass or denim being preferred, and it includes a back panel 12 and first and second front panels 14 and 16 which are sewn to the back panel 12 along seam lines 18 and 20. The front panels 14 and 16 also join to the back panel 12 in the shoulder region but, so that the vest can be illustrated as laying flat, the shoulder seams are illustrated as being opened and are represented by the dashed lines 22 and 24. It is also to be noted that the pattern for the vest is cut to provide arm openings 26 and 28.

Surrounding the waist region of the vest 10 are a series of spaced belt loops as at 26 through which a belt 28 may be fitted. The belt is illustrated as having a buckle 30 at one end thereof for mating with the opposite end 32 thereof in a conventional fashion.

The vest further includes closure means, here shown as Velcro ® hook and loop strips 34 and 36, whereby the vest can be closed about the wearer along the chest and stomach area. While a Velcro-style closure is illustrated, those skilled in the art will recognize that any other suitable arrangement, such as buttons, snaps, zippers, etc., may be utilized as well.

Attached to the exposed outer surface of the back panel 12 is an array of photovoltaic cells, as at 38, arranged in rows and columns with a predetermined spacing between each row and column to permit flexure of the vest fabric whereby the back panel can conform to the back of the wearer. The individual cells in the array are interconnected with one another in electrical series circuit by means of jumpers 40 connected to the respective positive and negative terminals of each of the individual photovoltaic cells 38.

In a somewhat similar fashion, if desired, additional photovoltaic cells 38 may also be appropriately secured to the chest panels 14 and 16 as illustrated in the developed drawing.

Wire or ribbon conductors as at 42 and 44 may be routed over the exterior of the vest or, preferably, sewn into the vest and are used to connect the positive and negative end-point terminals of the entire array to the input of a voltage regulator integrated circuit chip 46 mounted on or in the belt 28. The output from the regulator 46 is connected as an input to a suitable electrical selection switch 48, also attached to the belt 28. In this way, the electrical current developed in the photocell array can be selectively routed over conductors 50 to a bracket 52 to which a power cord 54 is joined. The power cord 54 terminates in a male plug 56 which may be temporarily clipped to the belt 28 but which is removable for insertion into a mating female jack on a hand-held power tool such as a battery-powered screwdriver or drill. As those skilled in the art will appreciate, such portable, battery-operated tools incorporate their own battery pack and, thus, the current generated by the photocell array when applied, via the power cord 54 and jack 56, will serve to maintain the charge on the power tool's own battery.

By selecting an alternative switch setting of the switch 48, the current generated by the photovoltaic cell array on the vest may be routed over wires 58 affixed to the belt 28 to one or more rechargeable battery packs contained within the carrying cases 60 and 62, also clipped to the belt 28 and suspended therefrom. These battery packs may be used to supply electrical current to tools or other devices which do not have their own self-contained rechargeable batteries.

While the individual cells 38 of the arrays may be bonded with a suitable adhesive to the fabric comprising the vest 10, other ways are recognized for adhering the photocells to the exposed surfaces of the fabric. For example, individual frames may be formed from elastic bands or cloth sewn to the vest fabric which allow the individual photovoltaic cells 38 to be slipped into and retained in those frames.

Those skilled in the art will also recognize that the vest comprising the preferred embodiment illustrated herein can be altered to produce more or less voltage/current by changing the number of photovoltaic cells employed or by altering the wiring patterns. That is to say, rather than having all cells connected in series, predetermined numbers of series connected cells can also be connected in parallel so as to produce power meeting the requirements of special tools.

With no limitation intended, the photocells employed may be of the type manufactured by Haines Solar Inc. Corporation of Scottsdale, Ariz. These cells typically measure 1.3"×4" and produce 0.45 volts DC at 1 ampere. A vest for an adult wearer can easily accommodate enough cells of the above dimension to produce 20 volts when exposed to direct sunlight.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to equipment details and operating procedures, can be accomplished without departing from the scope of the invention itself.

What is claimed is:

1. A solar to electrical energy garment comprising in combination:
   (a) a fabric suspension member adapted to be worn over the chest, shoulders and back of the wearer;
   (b) belt means attached to said suspension member for encircling the waist of the wearer;
   (c) a plurality of photovoltaic cells affixed to said suspension member as an array, the individual cells in said array being coupled in electrical series circuit between first and second output terminals;
   (d) conductor means routed along said suspension member and said belt means and connectable to said first and second output terminals; and
   (e) an electrical energy consisting device suspended from said belt and coupled to said conductor means.

2. The solar energy garment as in claim 1 wherein said energy consuming device is a rechargeable battery means.

3. The solar energy garment as in claim 2 and further including an electrical jack mounted on said belt and electrically connected to said rechargeable battery means.

4. The solar energy garment as in claim 1 and further including an electrical switch affixed to said belt and selectively electrically coupling said energy consuming device to said conductor means.

5. The solar energy garment as in claim 3 and further including electrical switch means affixed to said belt and selectively electrically coupling said conductor means to said rechargeable battery means or said electrical jack.

6. The solar energy garment as in claim 1 and further including voltage regulating means mounted on said belt and coupled to said conductor means.

7. The solar energy garment as in claim 1 wherein said photoelectric cells are adhesively attached to said back panel.

8. The solar energy garment as in claim 1 wherein said photoelectric cells are held in pockets sewn to said suspension member.

9. The solar energy vest as in claims 7 or 8 in which said plurality of photoelectric cells are rectangular in shape and arranged in a matrix of rows and columns spaced from one another to allow flexing of said fabric between said cells.

10. The solar energy garment as in any one of the claim 1 through 8 wherein send suspension member comprises a vest having a back panel and first and second chest panels sewn to one another to define arm openings, and said array of photovotaic cells being affixed to said back panel.

* * * * *

UNITED STATES PATENT AND TRADEMARK OFFICE
CERTIFICATE OF CORRECTION

PATENT NO. : 4,827,534

DATED : May 9, 1989

INVENTOR(S) : Alvin E. Haugen

It is certified that error appears in the above-identified patent and that said Letters Patent is hereby corrected as shown below:

Column 4, line 17, delete "consisting" and put instead -- consuming --.

Column 4, line 41, delete "back panel" and put instead -- suspension member --.

Column 4, line 51, delete "claim" and put instead -- claims --.

Column 4, line 51, delete "send" and put instead -- said --.

Signed and Sealed this

Tenth Day of October, 1989

*Attest:*

DONALD J. QUIGG

*Attesting Officer*   *Commissioner of Patents and Trademarks*